United States Patent
Lee et al.

(10) Patent No.: US 8,315,103 B2
(45) Date of Patent: Nov. 20, 2012

(54) FLASH MEMORY DEVICE AND OPERATING METHOD FOR CONCURRENTLY APPLYING DIFFERENT BIAS VOLTAGES TO DUMMY MEMORY CELLS AND REGULAR MEMORY CELLS DURING ERASURE

(75) Inventors: Chang-Hyun Lee, Suwon (KR); Jung-Dal Choi, Suwon (KR); Byeong-In Choe, YongIn (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 13/047,178

(22) Filed: Mar. 14, 2011

(65) Prior Publication Data

US 2011/0222340 A1   Sep. 15, 2011

Related U.S. Application Data

(62) Division of application No. 11/968,753, filed on Jan. 3, 2008, now Pat. No. 7,924,622.

(30) Foreign Application Priority Data

Aug. 14, 2007 (KR) .......... 10-2007-0081830

(51) Int. Cl.
*G11C 16/28* (2006.01)
(52) U.S. Cl. .......... 365/185.2; 365/185.17; 365/185.18; 365/185.26; 365/185.27; 365/185.23; 365/185.33
(58) Field of Classification Search .......... 365/185.17, 365/185.2, 185.18, 185.27, 185.26, 185.29, 365/185.33
See application file for complete search history.

(56) References Cited

U.S. PATENT DOCUMENTS

| | | | |
|---|---|---|---|
| 5,473,563 A | 12/1995 | Suh et al. | |
| 6,845,042 B2 | 1/2005 | Uchige et al. | |
| 6,987,694 B2 | 1/2006 | Lee | |
| 7,068,548 B2 | 6/2006 | Nakamoto et al. | |
| 7,079,437 B2 | 7/2006 | Hazama et al. | |
| 7,158,419 B2 | 1/2007 | Lee et al. | |
| 7,272,049 B2 | 9/2007 | Kang et al. | |
| 7,480,178 B2 | 1/2009 | Park et al. | |
| 7,652,926 B2 | 1/2010 | Kang et al. | |
| 7,924,622 B2 * | 4/2011 | Lee et al. | 365/185.2 |
| 2010/0128522 A1 | 5/2010 | Choi et al. | |

FOREIGN PATENT DOCUMENTS

| | | |
|---|---|---|
| JP | 11-16383 | 1/1999 |
| JP | 2004-127346 | 4/2004 |
| KR | 10-2005-0021616 | 3/2005 |
| KR | 10-2007-0029299 | 3/2007 |

* cited by examiner

*Primary Examiner* — Andrew Q Tran
(74) *Attorney, Agent, or Firm* — Myers Bigel Sibley & Sajovec, P.A.

(57) ABSTRACT

Integrated circuit flash memory devices, such as NAND flash memory devices, include an array of regular flash memory cells, an array of dummy flash memory cells and an erase controller. The erase controller is configured to concurrently apply a different predetermined bias voltage to the dummy flash memory cells than to the regular flash memory cells during an erase operation of the integrated circuit flash memory device. Related methods are also described.

8 Claims, 13 Drawing Sheets

|  | Conventional Program | Erase (present invention) | Conventional Verify | Conventional Read |
|---|---|---|---|---|
| Selected WL | Vpgm | 0 | Vvfy | 0 |
| Unselected WL | Vpass | Floating => coupled by Vers | Vread | Vread |
| Dummy WL | Vpass | VDL, Vpass, Vread, Vssl or Vbl | Vread | Vread |
| SSL | Vcc | Floating => coupled by Vers | Vread | Vread |
| GSL | 0 | Floating => coupled by Vers | Vread | Vread |
| CSL | 1.2 | Floating => Vers (P-N forward) | 0 | 0 |
| P-well | 0 | Vers | 0 | 0 |

FIG. 4

|  | Embodiment 1 | Embodiment 2 | Embodiment 3 |
|---|---|---|---|
| SSL | F | F | F |
| DWL<0> | 8 | 0 | Vread, Vpass, VDL, Vssl or Vbl |
| WLn | 0 | -10 | 0 |
| DWL<1> | 8 | 0 | Vread, Vpass, VDL, Vssl or Vbl |
| GSL | F | F | F |
| Bulk/Well | 20 | 10 | Vwell |

F: Floating

FIG. 8

FLASH MEMORY DEVICE AND OPERATING METHOD FOR CONCURRENTLY APPLYING DIFFERENT BIAS VOLTAGES TO DUMMY MEMORY CELLS AND REGULAR MEMORY CELLS DURING ERASURE

CLAIM OF PRIORITY

The present application is a divisional of and claims priority from U.S. patent application Ser. No. 11/968,753, filed Jan. 3, 2008, which claims priority under 35 U.S.C. §119 to Korean Patent Application No. 10-2007-0081830, filed Aug. 14, 2007, the disclosures of which are hereby incorporated by reference herein in their entireties.

FIELD OF THE INVENTION

This invention relates to flash memory devices and operating methods therefor, and more particularly to erase operations of flash memory devices.

BACKGROUND OF THE INVENTION

Integrated circuit flash memory devices are widely used nonvolatile memory devices that can be electrically erased in large blocks and reprogrammed. As is well known to those having skill in the art, NOR and NAND flash memory devices may be provided. NOR flash memory devices can provide random-access read and programming operations, but generally do not offer arbitrary random-access erase operations. NOR flash memory devices are generally programmed by hot carrier injection. In contrast, NAND flash memory devices generally are accessed for reading and writing by blocks or pages, but can provide relatively low cost and relatively high density. NAND flash memory devices may use Fowler-Nordheim (F-N) tunneling to store data.

A NAND flash memory device is described in U.S. Pat. No. 7,079,437 to Hazama et al. entitled "Nonvolatile Semiconductor Memory Device Having Configuration of NAND Strings With Dummy Memory Cells Adjacent to Select Transistors". As noted in the Abstract of this patent, a nonvolatile semiconductor memory device having a plurality of electrically rewritable nonvolatile memory cells connected in series together is disclosed. A select gate transistor is connected in series to the serial combination of memory cells. A certain one of the memory cells which is located adjacent to the select gate transistor is for use as a dummy cell. This dummy cell is not used for data storage. During data erasing, the dummy cell is applied with the same bias voltage as that for the other memory cells.

Another NAND-type flash memory cell is described in U.S. Patent Publication 2006/0239077 to Park et al., entitled "NAND Flash Memory Device Having Dummy Memory Cells and Methods of Operating Same". As noted in the Abstract of this patent publication, a NAND flash memory device includes a control circuit configured to apply, during a program operation, a first word line voltage to non-selected ones of a plurality of serially-connected memory cells, a second word line voltage greater than the first word line voltage to a selected one of the plurality of memory cells, and a third word line voltage lower than the first word line voltage to a dummy memory cell connected in series with the plurality of memory cells. In other embodiments, a control circuit is configured to program a dummy memory cell before and/or after each erase operation on a plurality of memory cells connected in series therewith. In still other embodiments, a control circuit is configured to forego erasure of a dummy memory cell while erasing a plurality of memory cells connected in series therewith.

SUMMARY OF THE INVENTION

Integrated circuit flash memory devices according to some embodiments of the present invention include an array of regular flash memory cells, an array of dummy flash memory cells and an erase controller that is configured to concurrently apply a different predetermined bias voltage to the dummy flash memory cells than to the regular flash memory cells during an erase operation of the integrated circuit flash memory device. As used herein, a "predetermined" bias voltage means that a specific bias voltage is generated and applied to a given flash memory cell, rather than allowing a given flash memory cell to float.

In some embodiments, the different predetermined bias voltage is applied by applying a read bias voltage, a pass bias voltage, a string selector line bias voltage, a bit line bias voltage or a predetermined bias voltage that is less than a floating voltage to the dummy flash memory cells, and concurrently applying a bias voltage that is less than the read bias voltage, the pass bias voltage, the string selector line bias voltage, the bit line bias voltage or the predetermined bias voltage that is less than the floating voltage, respectively, to the regular flash memory cells during the erase operation. In other embodiments, the erase controller is configured to concurrently apply a first predetermined positive bias voltage, such as 8V, to the dummy flash memory cells and a second predetermined bias voltage that is less than the first predetermined positive bias voltage, such as 0V, to the regular flash memory cells during the erase operation. In still other embodiments, the erase controller is configured to concurrently apply a second negative bias voltage, such as −10V, to the regular flash memory cells and a first bias voltage that is less negative than the second negative bias voltage, such as 0V, to the dummy flash memory cells during the erase operation.

Integrated circuit flash memory devices according to yet other embodiments of the present invention include an array of regular flash memory cells, an array of dummy flash memory cells and an erase controller that is configured to concurrently apply predetermined different first and second bias voltages to the dummy flash memory cells and to the regular flash memory cells, respectively, during an erase operation of the integrated circuit flash memory device, such that a potential difference between gates of the dummy flash memory cells and a well of the integrated circuit flash memory device is less than a potential difference between the gates of the regular flash memory cells and the well of the integrated circuit flash memory device during the erase operation. In some specific embodiments, the erase controller is configured to apply to the dummy flash memory cells a bias voltage corresponding to (1) a voltage that is applied to the dummy flash memory cells during a program operation (Vpass), (2) a voltage that is applied to the dummy flash memory cells during a read operation (Vread), (3) a predetermined voltage that is less than that which is coupled to a floating dummy flash memory cell by the well of the integrated circuit flash memory device (VDL) during the erase operation, (4) a voltage that is applied to a string selector transistor during a program operation (Vssl), or (5) a voltage that is applied to a bit line under a program-inhibit situation during a program operation (Vbl), and to concurrently apply a predetermined bias voltage that is (1) less than Vpass, (2) less than Vread, (3) less than VDL, (4) less than Vssl, or (5)

less than Vbl, respectively, such as of 0V, to the regular flash memory cells during the erase operation.

In still other embodiments, the erase controller is configured to concurrently apply a first predetermined positive bias voltage, such as 8V, to the dummy flash memory cells and a second predetermined positive bias voltage that is less than the first predetermined positive bias voltage, such as 0V, to the regular flash memory cells during the erase operation, while applying a positive well voltage, such as 20V, to a well of the integrated circuit flash memory device.

In still other embodiments, the erase controller is configured to concurrently apply a second negative bias voltage, such as −10V, to the regular flash memory cells and a first bias voltage hat is less negative than the second negative bias voltage, such as 0V, to the dummy flash memory cells during the erase operation, while applying a positive well voltage, such as 10V, to a well of the integrated circuit flash memory device.

In some embodiments of the invention, a high voltage generator is provided that is configured to supply a voltage Vpass that is applied to the dummy flash memory cells during a program operation, a voltage Vread that is applied to the dummy flash memory cells during a read operation, a voltage Vssl that is applied to a string selector transistor during a program operation and a voltage Vbl that is applied to a bit line under a program-inhibit situation during a program operation. In these embodiments, the erase controller may be configured to apply Vpass, Vread, Vssl or Vbl to the dummy flash memory cells during the erase operation, and to concurrently apply a bias voltage that is less than Vpass, Vread, Vssl or Vbl, respectively, such as 0V, to the regular flash memory cells during the erase operation.

Other embodiments of the invention provide a high voltage generator that is configured to supply a voltage Vpass that is applied to the dummy flash memory cells during a program operation, a voltage Vread that is applied to the dummy flash memory cells during a read operation, a voltage Vssl that is applied to a string selector transistor during a program operation, and a voltage Vbl that is applied to a bit line under a program-inhibit situation during a program operation. The high voltage generator is further configured to generate a dummy line voltage VDL that is less than that which is coupled to a floating dummy flash memory cell by a well of the integrated circuit flash memory device, during the erase operation. In these embodiments, the erase controller is configured to apply VDL to the dummy flash memory cells during the erase operation, and to concurrently apply a bias voltage that is less than VDL, such as 0V, to the regular flash memory cells during the erase operation.

Any and all embodiments of the present invention may be combined with a host device that is configured to write information into the memory device and to read information from the memory device. The host device may comprise a memory controller, a microprocessor, a camera, a wireless terminal, a portable media player, a desktop computer, a notebook computer and/or a vehicle navigation system.

Finally, embodiments of the invention have been described above in connection with an integrated circuit flash memory device, such as a NAND flash memory device, that includes an erase controller configured as described above. However, analogous methods of erasing an integrated circuit flash memory device also may be provided according to any and all of the embodiments of the invention that are described herein.

BRIEF DESCRIPTION OF THE DRAWINGS

FIG. 4 is a table that illustrates voltages that may be applied to a NAND flash memory device, such as a NAND flash memory device of FIG. 3, according to various embodiments of the present invention.

FIG. 8 is a table of operations that may be performed by controllers and/or methods for erasing integrated circuit flash memory devices according to various embodiments of the present invention.

DETAILED DESCRIPTION

Figure 1:
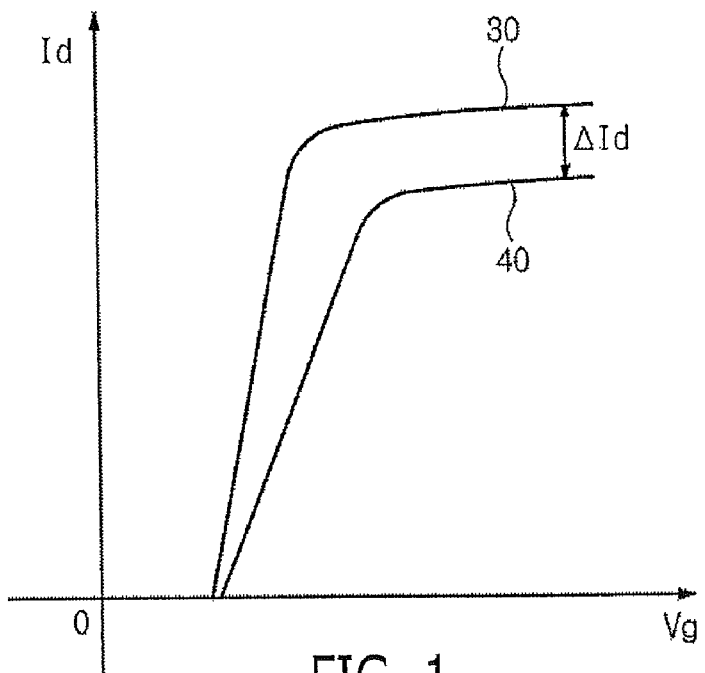
FIG. 1 graphically illustrates deterioration of flash memory cell drain current after a large number of erase cycles.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element is referred to as being "connected to", "coupled to" or "responsive to" another element (and variants thereof), it can be directly connected, coupled or responsive to the other element or intervening elements may be present. In contrast, when an element is referred to as being "directly connected to", "directly coupled to" or "directly responsive to" another element (and variants thereof), there are no intervening elements present. Like reference numerals refer to like elements throughout. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including" and variants thereof, when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It also will be understood that, as used herein, the terms "row" or "horizontal" and "column" or "vertical" indicate two relative non-parallel directions that may be orthogonal to one another. However, these terms also are intended to encompass different orientations.

Some embodiments of the present invention may arise from recognition that if the same bias voltage is applied to the dummy flash memory cells as to the regular flash memory cells during an erase operation of an integrated circuit NAND flash memory device, as described in U.S. Pat. No. 7,079,437, the dummy cells may undesirably experience the same erase stress as a regular memory cell. In particular, as shown in FIG. 1, since the NAND memory architecture connects the regular memory cells and the dummy memory cells in a serial string, both the regular flash memory cells and the dummy flash memory cells generally exhibit erase stresses shown as ΔId, which signifies the difference in drain current from the time of production 30 to a time after production after many cycles of erasing 40. The dummy cell current therefore deteriorates by the erase stress ΔId, and the read margin thereby may be decreased.

Figure 2:
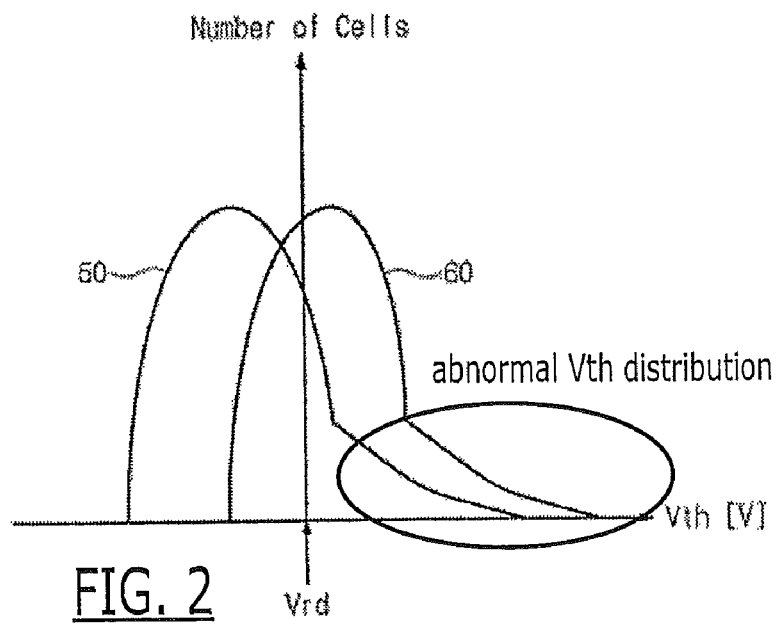
FIG. 2 graphically illustrates threshold voltage shift of flash memory cells after a large number of erase cycles.

Moreover, some embodiments of the present invention may also arise from recognition allowing the dummy word cells to float during an erase operation, as described in U.S. Patent Publication 2006/0239077, also may be undesirable. In particular, as illustrated in FIG. 2 at 50, after production, a range of threshold voltages may be exhibited by the dummy cells due to variations, for example, in the processing that is used to fabricate the integrated circuit flash memory devices. As also shown at 50, the threshold voltage Vth of some cells may be considered abnormal. Moreover, as shown at 60 of FIG. 2, after a large number of program erase cycles, the threshold voltage distribution may shift. Unfortunately, the dummy cells with the higher threshold voltage generally will not erase when they are left floating during an erase operation due to insufficient voltage being provided between the gate and well of the dummy cell, so as to allow electrons to escape from a charge storage area of the dummy cell. Fewer dummy cells may be erased over time, which may also degrade the read operation of the NAND memory device.

As is well known to those having skill in the art, in NAND flash memory devices, data erase is performed by applying a voltage between a control gate and a channel, corresponding to a well region of the flash memory cells, to thereby inject electrons from the channel onto the gate or, alternatively, to draw electrons out of the gate toward the channel.

Figure 3:
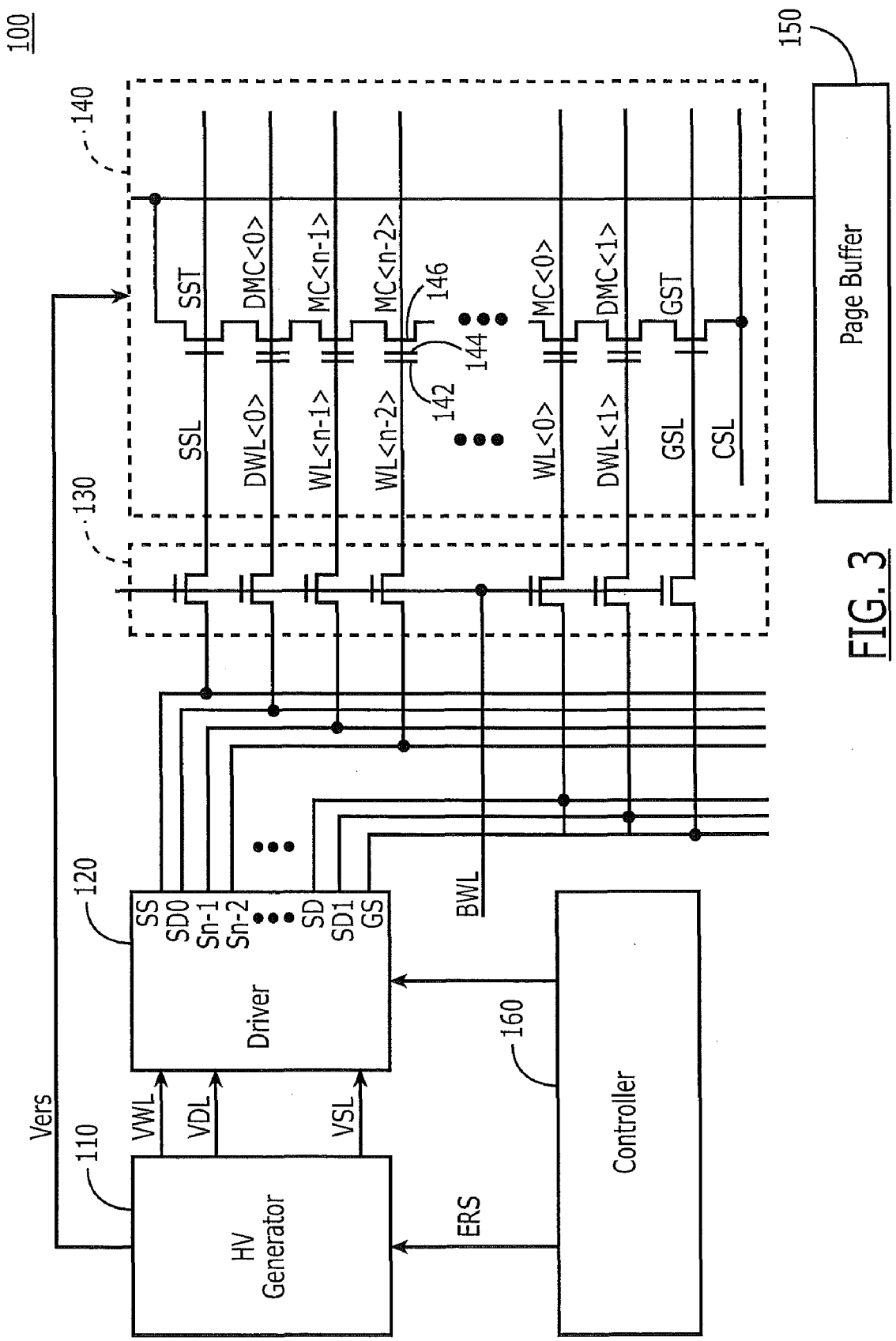
FIG. 3 is a schematic diagram of a NAND flash memory device according to various embodiments of the present invention.

FIG. 3 is a schematic diagram of a NAND flash memory device that can include an erase controller and operational methods according to various embodiments of the present invention. Referring now to FIG. 3, the NAND memory device 100 includes a memory cell array 140 that includes a plurality of regular flash memory cells MC and dummy flash memory cells DMC. Each of the regular memory cells MC and dummy memory cells DMC includes a floating gate 144 between a control gate 142 and a channel or well region 146. Each NAND string includes a plurality of regular flash memory cells MC and one or more dummy flash memory cells DMC serially connected. One or more string selection transistors SST/GST also may be provided. A regular word line WL or a dummy word line DWL is connected to the regular flash memory cells MC and dummy flash memory cell(s) DMC, respectively. In FIG. 3, a dummy memory cell DMC is provided at the top and bottom of each string of regular memory cells. However, other configurations also may be provided, as will be described below.

In addition to the memory cell array 140 itself, a plurality of pass gates 130, a page buffer 150, a driver 120, a high voltage generator 110 and a controller 160 may be provided. As also shown in FIG. 3, the high voltage generator 110 can generate a word line voltage VWL, a dummy line voltage VDL and a select line voltage VSL that are applied by the driver 120 to the various lines using techniques known to those having skill in the art. The high voltage generator 110 can also generate erase voltage Vers. Controllers 160 and/or high voltage generators 110 according to various embodiments of the invention will be described below.

FIG. 4 is a table that illustrates voltages that may be applied to a NAND flash memory device, such as a NAND flash memory device of FIG. 3, according to various embodiments of the present invention. FIG. 4 illustrates conventional program, verify and read operations. In the conventional program operation, a program voltage Vpgm is applied to a selected word line, and a pass voltage Vpass is applied to an unselected word line and a dummy word line. In a verify operation, a verify voltage Vvfy is applied to a selected word line, and a read voltage Vread is applied to an unselected word line and a dummy word line. In a read operation, 0V is applied to the selected word line, and a read voltage Vread is applied to the unselected word line and the dummy word line.

Referring now to the erase operation of FIG. 4, which is also indicated by "present invention" in FIG. 4, it can be seen that a different predetermined bias voltage is applied to the dummy flash memory cells via the dummy word line, than to a selected regular flash memory cell via a selected word line, during the erase operation. As used herein, a "predetermined" bias voltage means that a specific bias voltage is generated and applied to a given flash memory cell, rather than allowing a given flash memory cell to float. More specifically, in embodiments of FIG. 4, 0V is applied to the selected word line, whereas a predetermined voltage VDL, Vpass, Vread, Vssl or Vbl is applied to the dummy word line. These voltages will be described in detail below.

Still referring to the erase column of FIG. 4, a voltage of Vpass, Vread, VDL, Vssl or Vbl is applied to the dummy word line. Vpass corresponds to a pass bias voltage that is applied to an unselected word line or a dummy word line during the program operation. Vread corresponds to a voltage that is applied to an unselected word line or a dummy word line during a read operation. In some embodiments of FIG. 4, the pass voltage Vpass may be 8V and the read voltage Vread may be 6V. VDL is a predetermined bias voltage that is less than that which is coupled to a floating dummy flash memory cell by the well of the integrated circuit flash memory device during the erase operation. Vssl corresponds to a voltage that is applied to a String-Selector Line (SSL) of a string selector transistor during a program operation. Finally, Vbl is a voltage that is applied to a bit line under a program-inhibit situation during a program operation.

More specifically, memory cells are generally erased by a voltage difference between the word line and the P-well associated therewith. An erase voltage Vers, for example 20V, may be applied to the P-well in operations of FIG. 4. Dummy cells are soft erased by the voltage difference between the dummy word line and the P-well. Accordingly, VDL is set to be a predetermined bias voltage that is more than 0V but less than the dummy line voltage coupled by Vers in the case of a floating dummy cell. The abnormal dummy cells are reset by the soft erase, so that the error of the read operation may be reduced. In some embodiments of FIG. 4, about 18V may be coupled to a floating dummy flash memory cell by the well of the integrated circuit flash memory device, so that VDL may be a predetermined bias voltage of about 16V or about 17V that is generated and applied in some embodiments of the present invention.

Accordingly, erase operations of the present invention may provide a potential difference between the gates of the dummy flash memory cells and the well of the integrated circuit flash memory device that is less than a potential difference between control gates of the regular flash memory cells and the well of the integrated flash memory device during the erase operation.

Generalizing from the embodiments of FIG. 4, integrated circuit flash memory devices according to some embodiments of the present invention configure an erase controller to apply to the dummy flash memory cells a first predetermined bias voltage corresponding (1) a voltage that is applied to the dummy flash memory cells during a program operation (Vpass), (2) a voltage that is applied to the dummy flash memory cells during a read operation (Vread), (3) a predetermined voltage that is less than that which is coupled to a floating dummy flash memory cell by the well of the integrated circuit flash memory device (VDL) during the erase operation, (4) a voltage that is applied to a string selector transistor during a program operation (Vssl), or (5) a voltage that is applied to a bit line under a program-inhibit situation during a program operation (Vbl), and to concurrently apply a bias voltage that is (1) less than Vpass, (2) less than Vread, (3) less than VDL, (4) less than Vssl or (5) less than Vbl, respectively, such as 0V, to the regular flash memory cells during the erase operation.

Figure 5A:
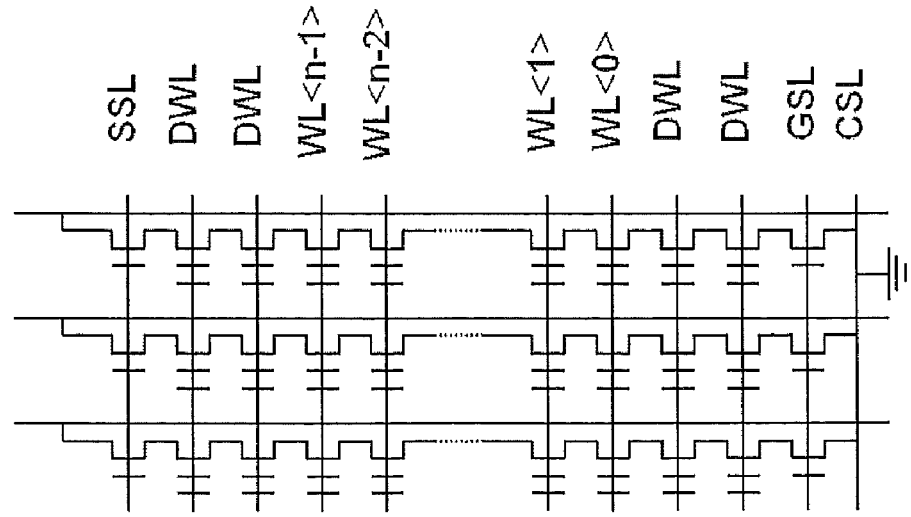
FIGS. 5A-5C illustrate alternate embodiments of integrated circuit flash memory cell arrays of FIG. 3.
Figure 5B:
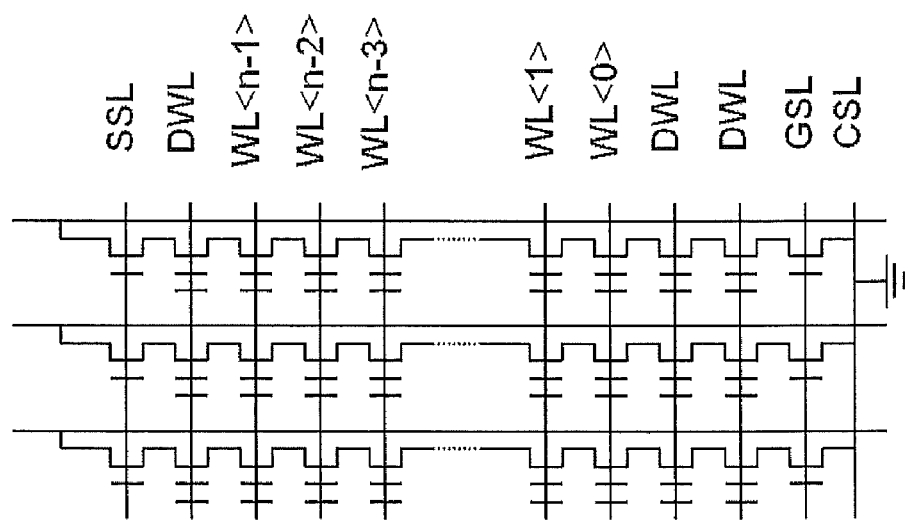
Figure 5C:
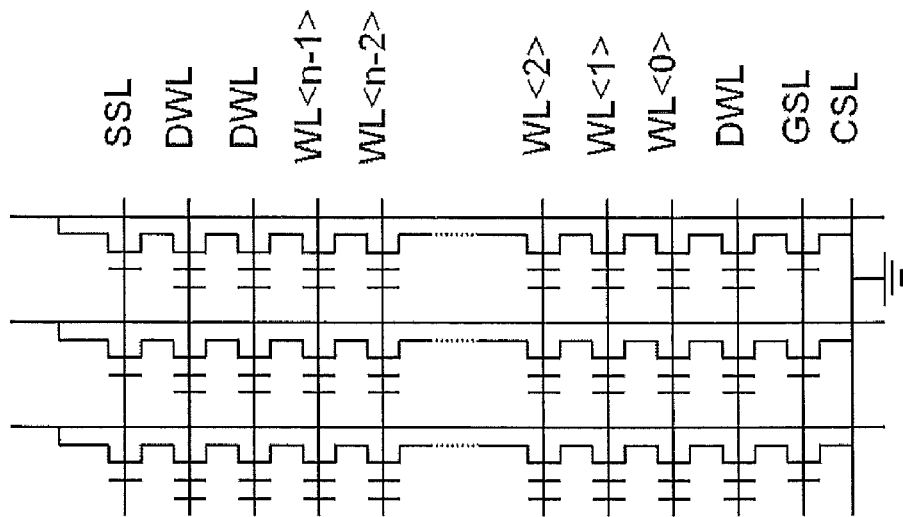

FIGS. 5A-5C illustrate alternate embodiments of integrated circuit flash memory cell arrays 140 of FIG. 3. Recall that in FIG. 3, a single dummy memory cell is used at the top and the bottom of each string of regular memory cells MC. In contrast, in FIG. 5A, two dummy memory cells are used at the top and bottom of each string of regular memory cells. In embodiments of FIG. 5B, a single dummy cell is used at the top and a pair of dummy cells is used at the bottom of each NAND string, whereas in FIG. 5C, two dummy cells are used at the top and a single dummy cell is used at the bottom of a given NAND string. Various other configurations of dummy cells and regular cells may be used in various embodiments of the present invention, and need not be described further herein.

Figure 6:
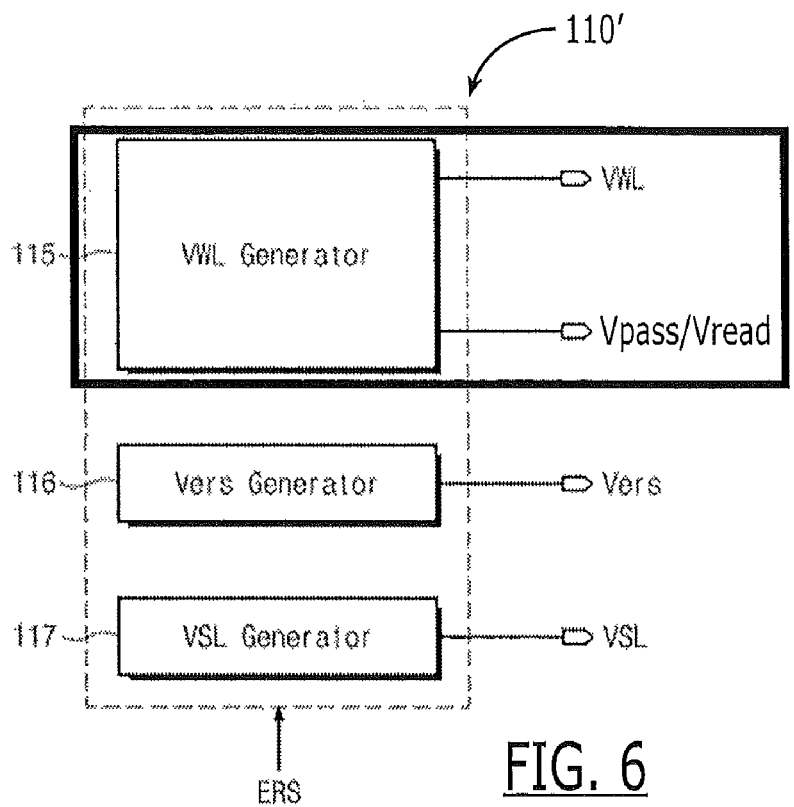
FIGS. 6 and 7 are block diagrams of high voltage generators according to various embodiments of the present invention.

Referring back to FIGS. 3 and 4, as was already described, some embodiments of the present invention provide the pass voltage Vpass or the read voltage Vread to the dummy word lines during the erase operation. In these embodiments, an existing high voltage generator 110 may be used and a driver 120 and/or controller 160 may be modified to also provide the read voltage Vread or pass voltage Vpass to the dummy word lines during the erase operation. Accordingly, as shown in FIG. 6, a high voltage generator 110' may include a word line voltage generator 115 that applies the word line voltages VWL and also generates the pass voltage Vpass or read voltage Vread. The string selector line bias voltage and the bit line bias voltage also may be generated. An erase voltage generator 116 and a select line voltage generator 117 may also be provided. Thus, the bias voltages Vread or Vpass may be applied to the dummy word lines and an additional dummy line voltage generator need not be provided. The high voltage generator 110' generates erase operation voltages in response to a mode signal ERS, which is transferred from the controller 160 and signifies an erase mode.

Figure 7:
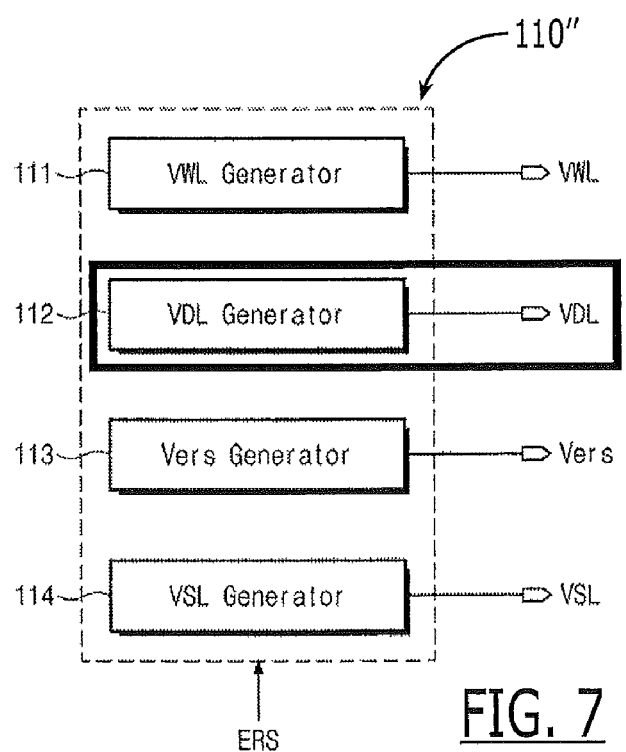

In contrast, when a dummy word line voltage VDL is generated that is less than that which is coupled to a floating dummy flash memory cell by the well of the integrated circuit flash memory device, a separate generator for this predetermined bias voltage VDL may need to be provided. Thus, as shown in FIG. 7, a conventional word line voltage generator 111, an erase voltage generator 113 and select line voltage generator 114 may be provided. However, a VDL generator 112 also may be provided that generates the dummy line voltage VDL, as was described above. The high voltage generator 110" generates erase operation voltages in response to a mode signal ERS, which is transferred from the controller 160 and signifies an erase operation. Accordingly, a separate VDL generator 112 may be provided in a high voltage generator 110" to generate the VDL voltage, which is then applied to the dummy cells during erase.

FIG. 8 summarizes controllers and methods for erasing integrated circuit flash memory devices according to various embodiments of the present invention. Embodiment 3 corresponds to the second column of FIG. 4 that was identified by "present invention", in that the SSL and GSL are floating (signified by F), the P-well or bulk is provided with an erase voltage Vwell, the selected word line is biased at 0V, and the dummy word lines are biased at Vread, Vpass, VDL, Vssl or Vbl. Thus, Embodiment 3 illustrates embodiments of the present invention wherein the erase controller is configured to apply to the dummy flash memory cells a first predetermined bias voltage corresponding to (1) Vpass, (2) Vread, (3) VDL (4) Vssl or (5) Vbl during the erase operation, to concurrently apply the bias voltage that is (1) less than Vpass, (2) less than Vread, (3) less than VDL, (4) less than Vssl or (5) less than Vbl, respectively, such as 0V, to the regular flash memory cells during the erase operation.

In contrast, in Embodiment 1, the dummy line is biased at 8V, the selected word line is biased at 0V and the bulk or well is biased at 20V. Accordingly, Embodiment 1 illustrates embodiments of the present invention wherein the erase controller is configured to concurrently apply a first predetermined positive bias voltage, such as 8V, to the dummy flash memory cells, and the second predetermined positive bias voltage that is less than the first predetermined bias voltage, such as 0V, to the regular flash memory cells during the erase operation, while applying a positive well voltage, such as 20V, to a well of the integrated circuit flash memory device.

Moreover, in Embodiment 2, the dummy cells are biased at 0V, the selected word line is biased at −10V and the bulk or well is biased at 10V during the erase operation. Accordingly, Embodiment 2 illustrates embodiments of the present invention wherein the erase controller is configured to concurrently apply a second negative bias voltage, such as −10V, to the regular flash memory cells, and a first bias voltage, such as 0V, that is less negative than the second negative bias voltage, to the regular flash memory cells during the erase operation, while applying a positive well voltage, such as 10V, to a well of the integrated circuit flash memory device.

In each of the cases illustrated in FIG. 8, the potential difference between the regular word line and the well is greater than the potential difference between the dummy word line and the well during erase. More particularly, in Embodiment 3, the difference between the regular cell voltage and the well voltage is Vwell minus 0V or Vwell, whereas the difference between the dummy word line and the well is Vwell minus Vread or Vpass or VDL, so that the potential difference between the regular cell and the well is greater than the potential difference between the dummy cell and the well during erase. Similarly, in Embodiment 2, the potential difference between the regular cell and the well is 10V minus −10V or 20V, whereas the potential difference between the dummy cell and the well is 10V minus 0V or 10V. Finally, in Embodiment 1, the difference between the regular cell and the well is 20V minus 0V or 20V, and the difference between the dummy and the well is 20V minus 8V or 12V. Thus, in all of these embodiments, the potential difference between the regular cell and the well is greater than the potential difference between the dummy cell and the well during erase. Stated differently, first and second predetermined bias voltages are applied to the dummy flash memory cells and to the regular flash memory cells, respectively, such that a potential difference between the gates of the dummy flash memory cells and a well of the integrated circuit flash memory device is less than a potential difference between the gates of the regular flash memory cells and the well of the integrated circuit flash memory device during the erase operation.

Figure 9:
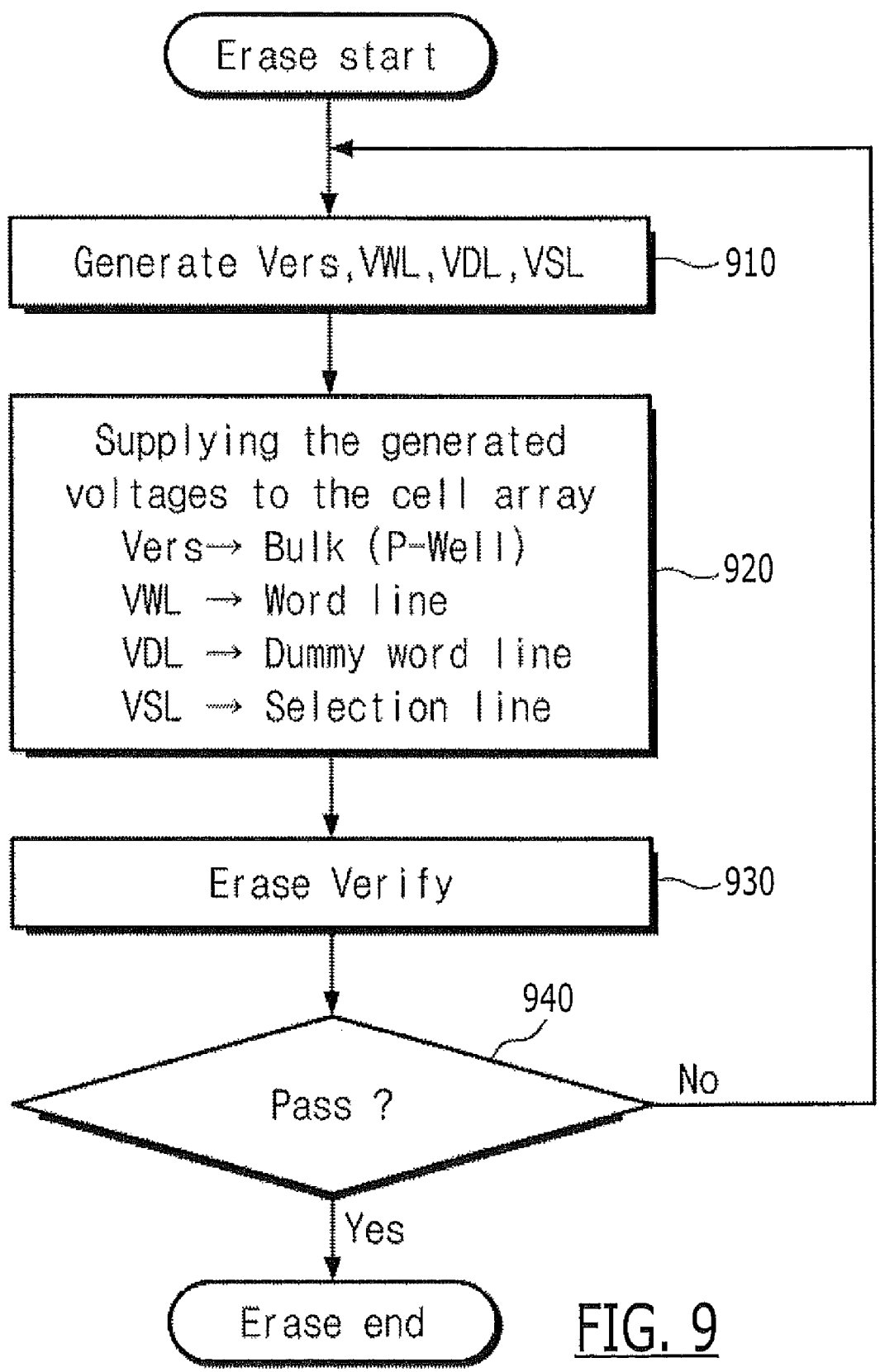
FIG. 9 is a flowchart of operations that may be performed to erase an integrated circuit flash memory device according to various embodiments of the present invention.
Figure 10:
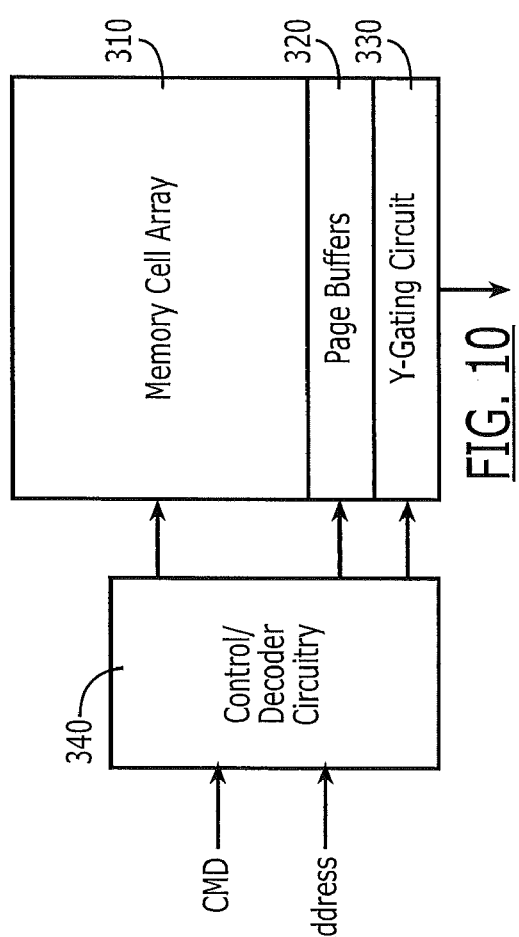
FIG. 10 is an overall block diagram of a NAND flash memory device that includes a memory cell array according to various embodiments of the present invention.
Figure 11:
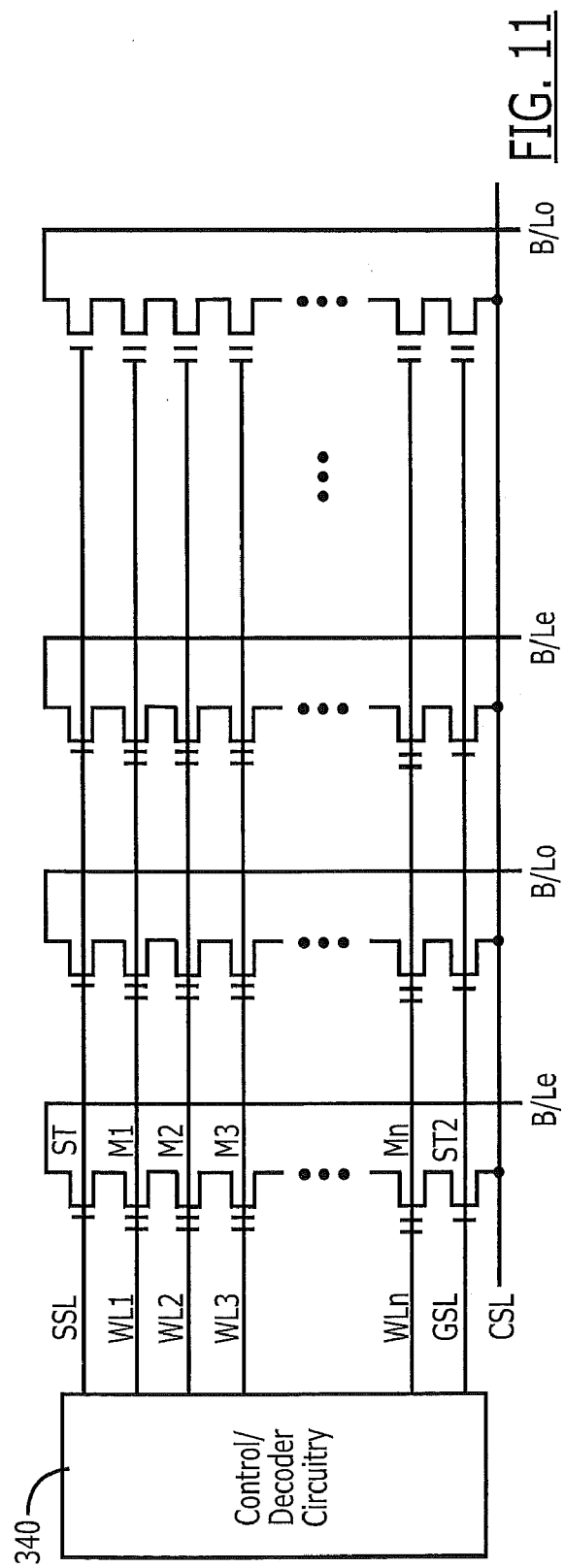
FIG. 11 illustrates a NAND cell array according to various embodiments of the present invention in combination with a control/decoder circuit.

FIG. 9 is a flowchart of operations that may be performed to erase an integrated circuit flash memory device according to various embodiments of the present invention. These embodiments may be performed by the high voltage generators 110, 110', 110" in conjunction with the controller 160 and driver 120 of FIG. 3. Specifically, referring to FIG. 9, the erase voltage Vers, the word line voltage VWL, the dummy line voltage VDL and the select line voltage VSL are generated at Block 910. As was already explained, rather than a predetermined dummy line bias voltage VDL, the pass voltage Vpass, the read voltage Vread, the string selector line bias voltage Vssl or the bit line bias voltage Vbl may be substituted. Then, at Block 920, the generated voltages are supplied to the cell array by providing VDL, Vpass, Vread, Vssl or Vbl to the dummy word line, and providing the other voltages as shown. An erase verify operation is then performed at Block 930, and if the erase verify operation is successful, then the erase ends. If not, operations of Block 910, 920 and 930 are again performed. FIG. 10 is an overall block diagram of a NAND flash memory device that includes a memory cell array 310 according to any of the herein described embodiments of the present invention. Page buffers 320 and a Y-gating circuit 330 are provided, as well as a control/decoder circuitry 340 that is responsive to commands CMD and addresses ADDRESS. FIG. 11 illustrates a NAND cell array 310 and the control/decoder circuit 340 of FIG. 10.

Figure 12:
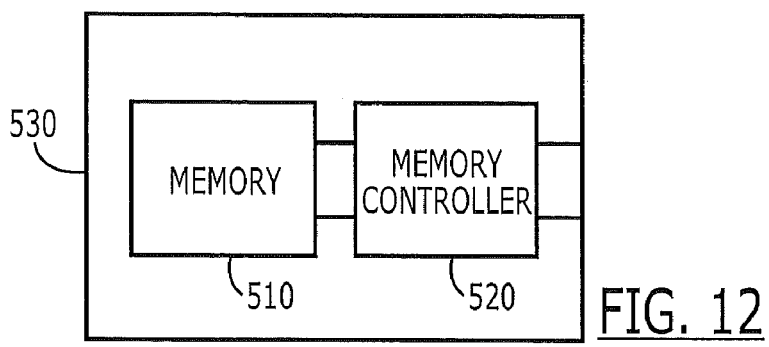
FIGS. 12-21 illustrate memory devices according to various embodiments of the present invention in combination with various host devices.
Figure 13:
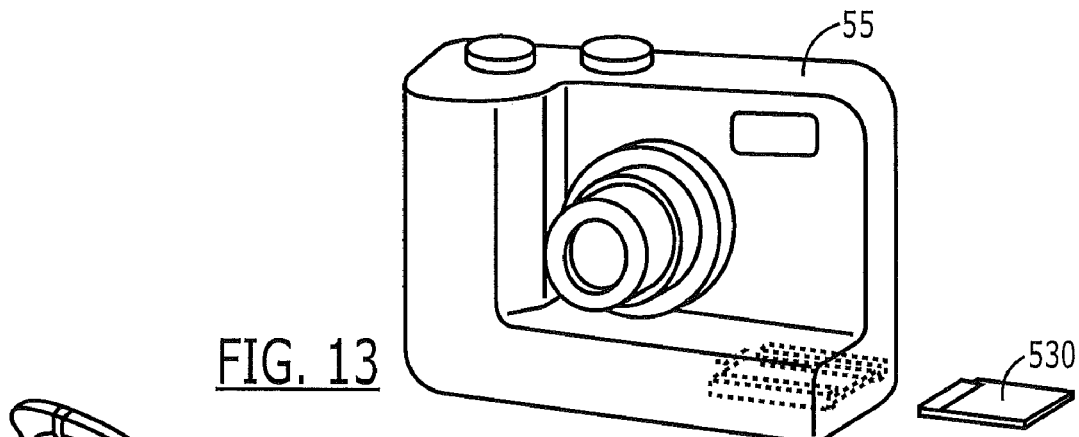
Figure 14:
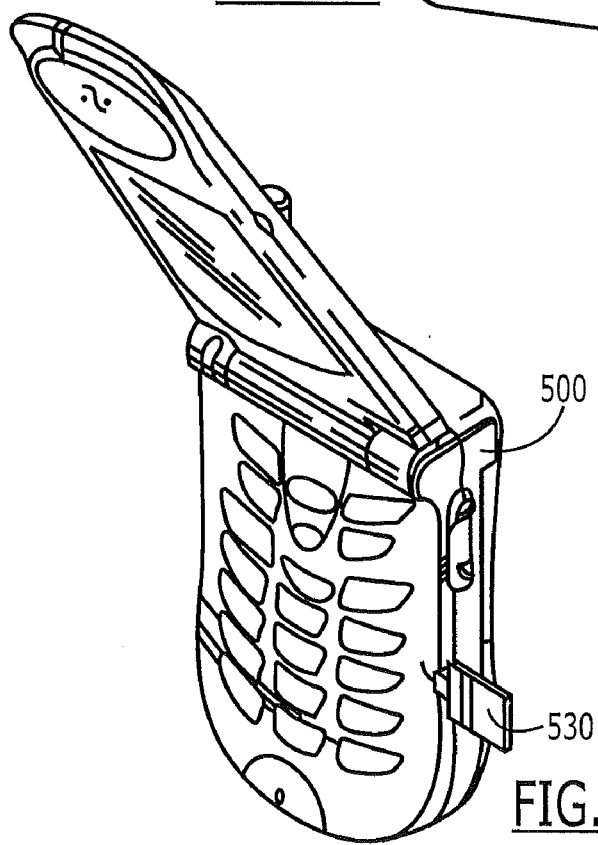
Figure 15:
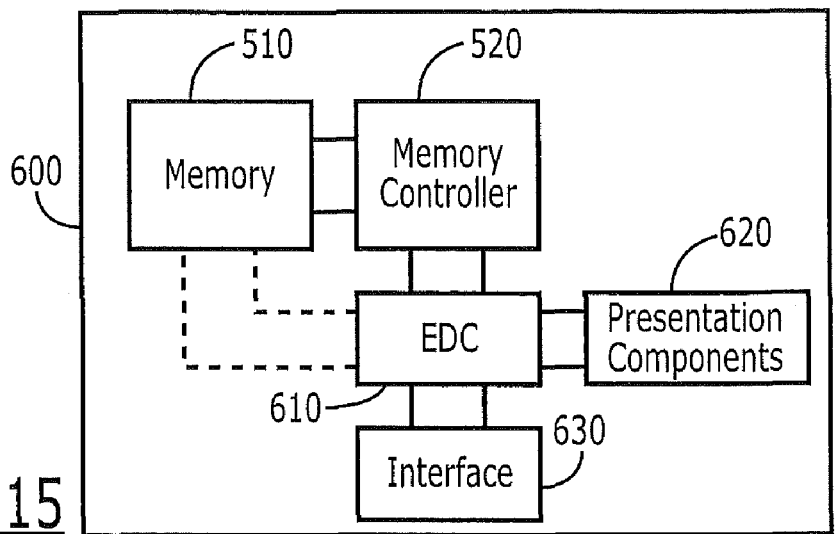
Figure 16:
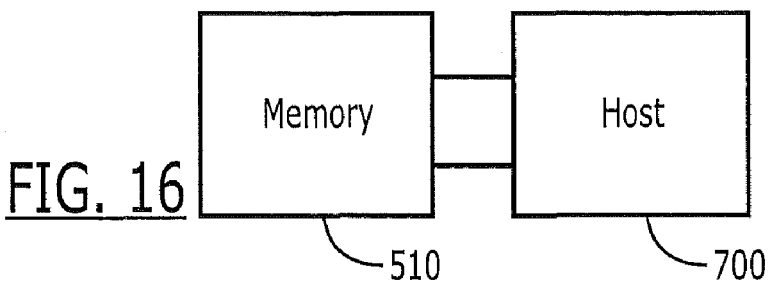
Figure 17:
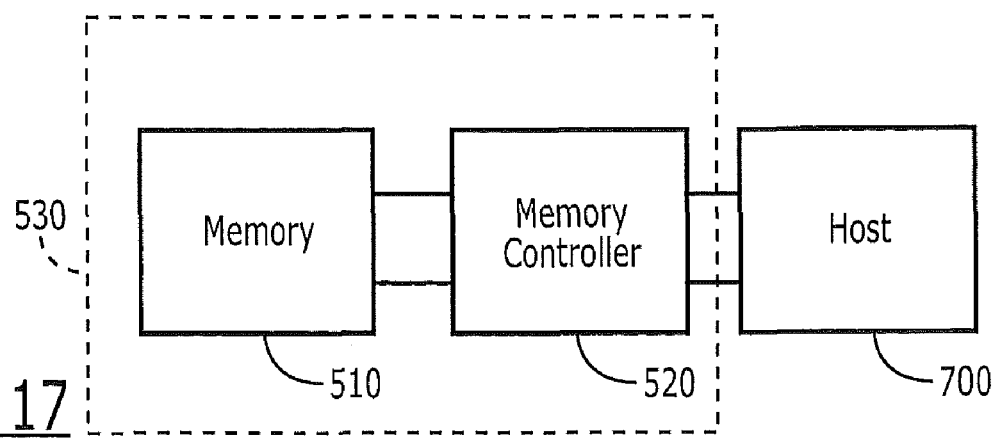
Figure 18:
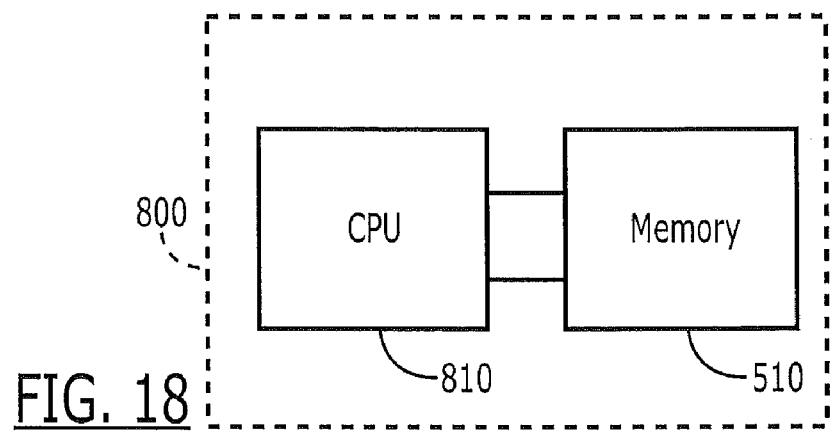
Figure 19:
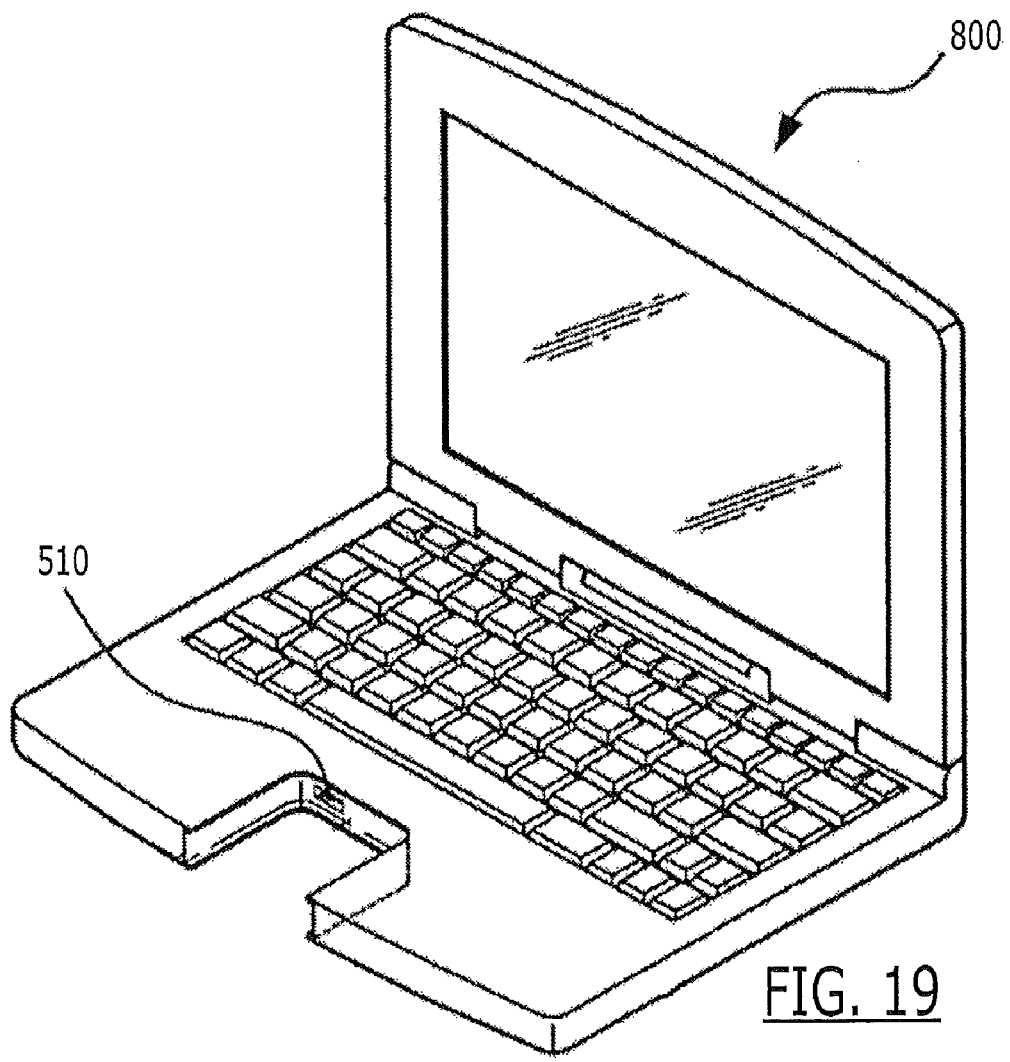
Figure 20:
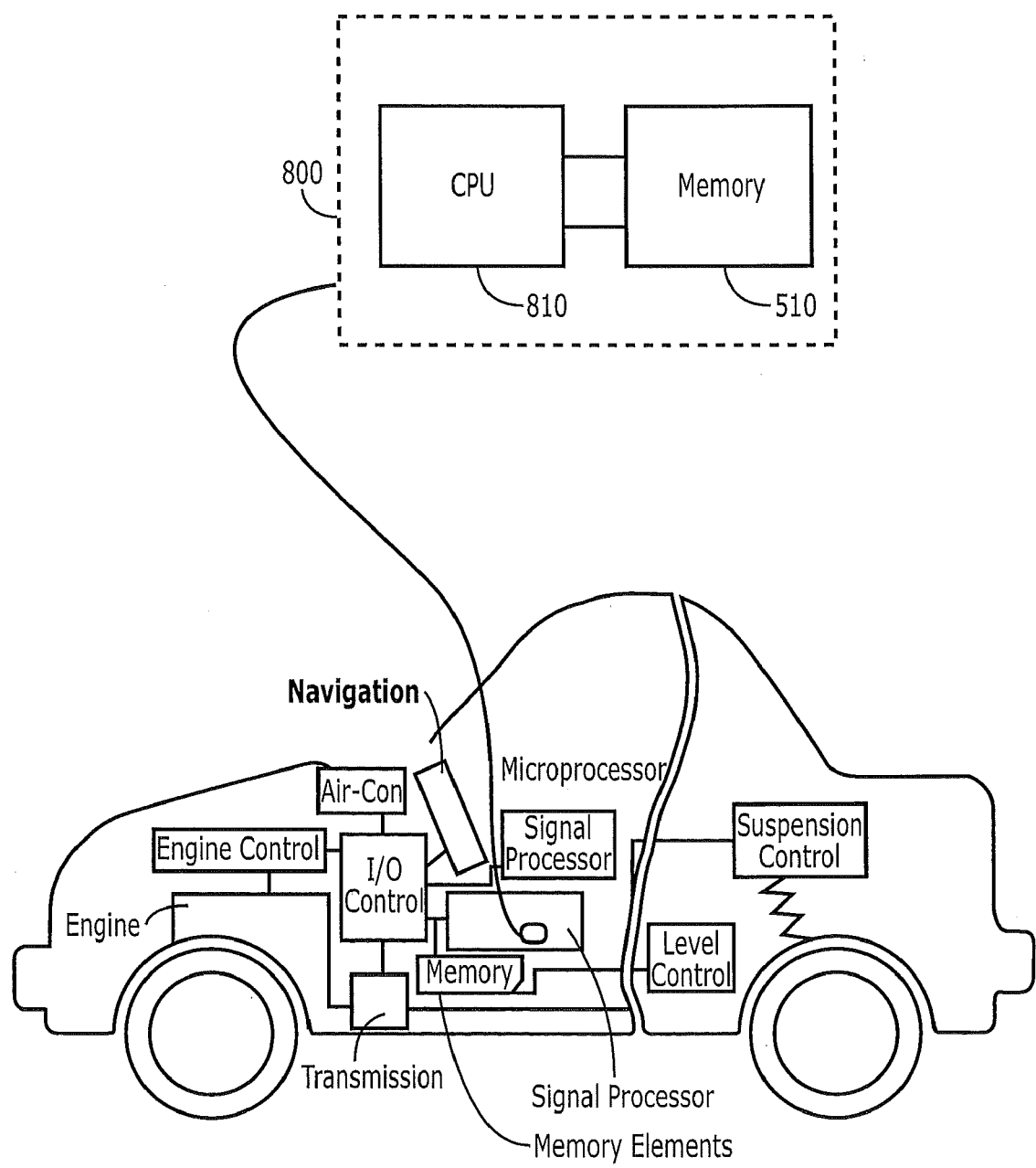
Figure 21:
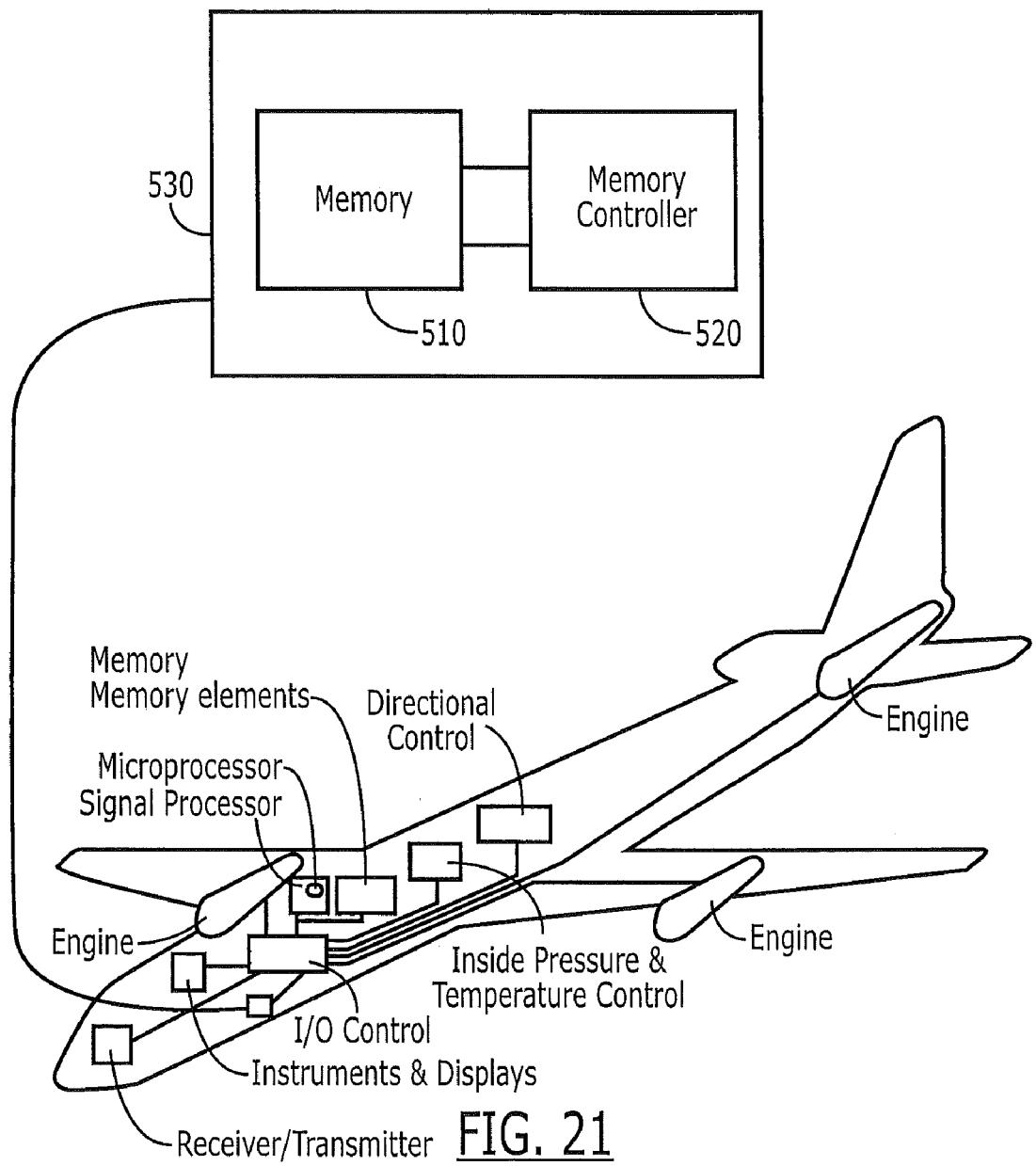

Memory devices according to various embodiments of the present invention may be employed in combination with a host device that is configured to write information into the memory devices and to read information from the memory devices. Thus, for example, FIG. 12 illustrates a memory card 530 that includes a memory controller 520 and a memory 510 according to any embodiments of the present invention. FIG. 13 illustrates the use of a memory card 530 in a digital camera 55. FIG. 14 illustrates the use of a memory card 530 in a wireless terminal, such as a mobile phone 500. FIG. 15 illustrates a memory device 510 according to any embodiments of the present invention in combination with a portable media player 600, such as an MP3 player or other portable player device, and can include a memory controller 520, a device controller 610, an interface 630 and presentation components 620. FIG. 16 illustrates a memory 510 in combination with a general host 700 and FIG. 17 illustrates integration of the memory 510 and a memory controller 520 onto a card 530 and used with a host 700, which can be a personal computer. FIG. 18 illustrates a card 800 that includes a CPU 810 and a memory 510 and that may be included in a notebook computer 800 shown in FIG. 19. The card 800 may be used instead of, or in addition to, hard disk drives. FIG. 20 includes a vehicle 800 that includes a microprocessor 800 having a CPU 810 and memory 510 according to any embodiments of the present invention and that may be used as part of a vehicle navigation system. Finally, FIG. 21 illustrates a memory card 530 including memory 510 according to any embodiments of the present invention and a memory controller 520 that can be used as part of an airplane navigation system.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit flash memory device comprising:
an array of regular flash memory cells;
an array of dummy flash memory cells;
an array of selection transistors, wherein a plurality of regular flash memory cells, at least one dummy flash memory cell and at least one selection transistor are serially connected to provide a NAND flash memory device; and
an erase controller that is configured to concurrently apply a different predetermined bias voltage to the dummy flash memory cells than to the regular flash memory cells during an erase operation of the integrated circuit flash memory device;
wherein the erase controller is configured to apply a read bias voltage, a pass bias voltage, a string selector line bias voltage, a bit line bias voltage or a predetermined bias voltage that is less than a floating voltage, to the dummy flash memory cells and to concurrently apply a bias voltage that is less than the read bias voltage, the pass bias voltage, the string selector line bias voltage, the bit line bias voltage or the predetermined bias voltage that is less than the floating voltage, respectively, to the regular flash memory cells during the erase operation.

2. An integrated circuit flash memory device according to claim 1 wherein the erase controller is configured to concurrently apply a first predetermined positive bias voltage to the dummy flash memory cells and a second predetermined positive bias voltage that is less than the first predetermined positive bias voltage to the regular flash memory cells during the erase operation.

3. An integrated circuit flash memory device according to claim 1 wherein the erase controller is configured to concurrently apply a second negative bias voltage to the regular flash memory cells and a first negative bias voltage that is less negative than the second negative bias voltage to the dummy flash memory cells during the erase operation.

4. An integrated circuit flash memory device according to claim 1 wherein the different predetermined bias voltages exclude floating the dummy flash memory cells or the regular flash memory cells during the erase operation.

5. A method of erasing an integrated circuit flash memory device that includes an array of regular flash memory cells, an array of dummy flash memory cells and an array of selection transistors, wherein a plurality of regular flash memory cells, at least one dummy flash memory cell and at least one selection transistor are serially connected to provide a NAND flash memory device, the method comprising concurrently applying a different predetermined bias voltage to the dummy flash memory cells than to the regular flash memory cells during an erase operation of the integrated circuit flash memory device;

wherein concurrently applying a different predetermined bias voltage comprises applying a read bias voltage, a pass bias voltage, a string selector line bias voltage, a bit line bias voltage, or a predetermined bias voltage that is less than a floating voltage, to the dummy flash memory cells and concurrently applying a bias voltage that is less than the read bias voltage, the pass bias voltage, the string selector line bias voltage, the bit line bias voltage or the predetermined bias voltage that is less than the floating voltage, respectively, to the regular flash memory cells during the erase operation.

6. A method according to claim 5 wherein concurrently applying a different predetermined bias voltage comprises applying a first predetermined positive bias voltage to the dummy flash memory cells and a second predetermined positive bias voltage that is less than the first predetermined positive bias voltage to the regular flash memory cells during the erase operation.

7. A method according to claim 5 wherein concurrently applying a different predetermined bias voltage comprises applying a second negative bias voltage to the regular flash memory cells and a first negative bias voltage that is less negative than the second negative bias voltage to the dummy flash memory cells during the erase operation.

8. A method according to claim 5 wherein concurrently applying a different predetermined bias voltage excludes allowing the dummy flash memory cells or the regular flash memory cells to float during the erase operation.

* * * * *